(12) United States Patent
Patel et al.

(10) Patent No.: US 6,418,017 B1
(45) Date of Patent: Jul. 9, 2002

(54) HEAT DISSIPATING CHASSIS MEMBER (75) Inventors: Chandrakant D. Patel, Fremont; Marvin S. Keshner, Mtn. View, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/539,724

(22) Filed: Mar. 30, 2000

(51) Int. Cl.[7] .................................................. H05K 7/20
(52) U.S. Cl. .................. 361/700; 174/15.2; 165/104.33
(58) Field of Search .............................. 165/80.2–80.4, 165/185, 104.26, 104.33; 174/15.2; 361/687–689, 700–703, 709–710, 715

(56) References Cited

U.S. PATENT DOCUMENTS

| | | | | |
|---|---|---|---|---|
| 5,179,500 A | * | 1/1993 | Koubek et al. ............... | 361/699 |
| 5,199,165 A | * | 4/1993 | Carwford et al. ............ | 174/15.2 |
| 5,283,715 A | * | 2/1994 | Carlsten et al. ............. | 174/15.2 |
| 5,353,192 A | * | 10/1994 | Nordin ......................... | 361/700 |
| 5,818,693 A | * | 10/1998 | Garner et al. ................ | 361/700 |
| 5,875,095 A | * | 2/1999 | Webb ........................... | 361/700 |
| 5,884,693 A | * | 3/1999 | Austin et al. ............. | 165/104.33 |
| 5,969,940 A | * | 10/1999 | Sano et al. ................... | 361/687 |
| 5,973,920 A | * | 10/1999 | Altic et al. .................. | 361/687 |
| 6,073,684 A | * | 6/2000 | Fiechter et al. .......... | 165/104.33 |
| 6,169,247 B1 | * | 1/2001 | Craft, Jr., et al. ............ | 174/15.2 |
| 6,178,088 B1 | * | 1/2001 | Gates ........................... | 361/699 |
| 6,181,558 B1 | * | 1/2001 | Gordon ....................... | 361/699 |
| 6,205,022 B1 | * | 3/2001 | Bhatia et al. ................ | 361/687 |

* cited by examiner

*Primary Examiner*—Gregory Thompson (57) ABSTRACT

The invention provides a chassis member, which may be made of a cast material such as magnesium, aluminum, or plastic, for mechanically supporting a heat producing electronic device in which the chassis member has a base and a cavity integral to the chassis member. In a preferred embodiment, the cavity is in the form of a channel that is created by boring. The channel may be evacuated and has an evaporator section, a condenser section, and a working fluid confined therein by a seal. The channel receives heat from an electronic device in an evaporator section of the channel and dissipates heat from the condenser section of the channel. Different types of wicks may be employed. In one embodiment, a completely fabricated heat pipe is inserted into the integrated channel. In other embodiments, a cavity in the form of a heat dissipating channel matrix, serpentine shape, flat shape, or in other forms or shapes are provided.

19 Claims, 12 Drawing Sheets

HEAT DISSIPATING CHASSIS MEMBER

BACKGROUND OF THE INVENTION

The present invention relates to portable electronic equipment such as portable computers. More specifically, the present invention relates to dissipating heat that is generated by electronic devices within portable computers or other portable electronic equipment. For illustration purposes, this invention is described with reference to a portable computer.

Portable computers include various electronic devices that generate heat while the devices operate. For example, the central processing unit may generate eight to twelve watts, or more, and various other devices may generate a few watts per device. As a result, the devices may collectively generate twenty-five to thirty watts, or more.

Excess heat can damage electronic devices thereby shortening their lives. Accordingly, the portable computer industry has recognized a need to provide heat dissipation features in computers. It is well known to dissipate heat through the use of fans and heat pipes, for example.

In the prior art, heat pipes are fabricated separately from the chassis and such heat pipes are mechanically fastened to a chassis, as by screws, clips, or other fasteners, or by epoxy or by way of fixtures external to chassis members or bases. Accordingly, prior art heat pipes have a junction between the heat pipe and the chassis member that the heat pipe is attached to. This junction introduces thermal contact resistance, that is, it reduces heat conductivity at the junction making heat dissipation more difficult to achieve.

A heat pipe is a sealed vessel containing a working fluid and the vessel may be evacuated. Evacuation lowers the boiling point of the working fluid. In this specification, when the term "evacuated" is used, it means evacuated to the extent necessary for lowing the boiling point of a working fluid to a desired temperature.

The vessel of a heat pipe has an evaporator section, an adiabatic section, and a condenser section and the vessel may contain a wick. In operation, electronic devices produce heat which is absorbed in the evaporator section of the heat pipe which causes evaporation into vapor of working fluid that is in the evaporator section. Working fluid in the form of vapor moves through the adiabatic section to the condenser section where it gives up its latent heat and condenses into fluid. A wick provides capillary action to provide return movement of fluid from the condenser section to the evaporator section.

Known wicks include fiber bundle wicks, mesh wicks, sintered wicks, grooved wicks, rough surface wicks, and others.

An example of use of heat pipes with magnesium or aluminum chassis members is disclosed in U.S. Pat. No. 5,973,920 to Altic, et al. A heat frame is formed from a piece of material such as magnesium or aluminum. A heat pipe carrier is provided in the frame as a location into which a heat pipe is mounted. The heat frame also features fins and a heat sink. While the Altic patent refers to a "heat frame" the heat frame also provides mechanical support for the computer or for components of the computer and the heat frame it therefore functions as a chassis member in addition to its heat dissipating function.

U.S. Pat. No. 5,875,095 to Webb discloses an arrangement in which a heat sink structure forms a structural portion of a chassis of a computer. This arrangement features a channel and a heat pipe is disposed in the channel.

U.S. Pat. No. 5,884,693 to Austin et al. discloses an enclosure for housing electronics components in which a heat pipe is incorporated into the enclosure. The enclosure has a cabinet design with a hinged door which allows access to the components. This disclosure states that the material of the heat pipe may be for example, copper, gold, or aluminum. At the top of the enclosure an evaporator is located to receive heat that rises. A condenser is located at the bottom of the enclosure. The walls of the enclosure are hollow to provide passageways for fluid and vapor as they move between the evaporator and condenser. The enclosure is designed to be non-portable and buried in the earth at a fixed location.

Magnesium is a material that is commonly used to fabricate the chassis members of portable computers since this material is lightweight and since it provides a shield to reduce emission of radio frequency radiation from the computer. Plastics are also used to fabricate chassis members but plastics do not dissipate heat well. Aluminum may be used for chassis members but aluminum weighs more (is denser) than magnesium.

Magnesium has a density which is approximately seventy percent that of aluminum. However, the thermal conductivity of cast magnesium is about one-half that of cast aluminum. Accordingly, selection of magnesium instead of aluminum for a chassis member means that the savings in weight offered by magnesium is accompanied by a disadvantageous reduction in heat dissipation capacity of the magnesium chassis member.

It can be understood that a greater choice of alternative ways of providing heat dissipation means for protecting electronic equipment from damage caused by heat will be beneficial to the electronic industry. In particular, it can be seen that improvement in the heat dissipation capability of cast magnesium chassis members will be beneficial to the electronic industry. The present invention provides such alternative and improved means.

SUMMARY OF THE INVENTION

The invention provides a chassis member, which may be made of a cast or molded material such as magnesium, aluminum, or plastic, for mechanically supporting a heat producing electronic device in which the chassis member has a base and a cavity integral to the base. In a preferred embodiment, the cavity is a channel that is created by boring. The channel may be evacuated and the channel has an evaporator section, a condenser section, and a working fluid confined therein by a seal. The channel receives heat from an electronic device in an evaporator section of the channel and dissipates heat from the condenser section of the channel. In one embodiment a pedestal which may be an integral part of the chassis member provides for thermal coupling of heat from an electronic device to the evaporator section and a heat sink, such as a finned area, provides for thermal coupling of heat from the condenser area to the ambient air. Different types of wicks may be employed. In one embodiment, a completely fabricated heat pipe is inserted into the integrated channel. In another embodiment, the cavity is a matrix of channels which is provided integral to the chassis member. In other embodiments, the cavity has other shapes integral to the chassis member.

DETAILED DESCRIPTION OF THE INVENTION

Figure 1:
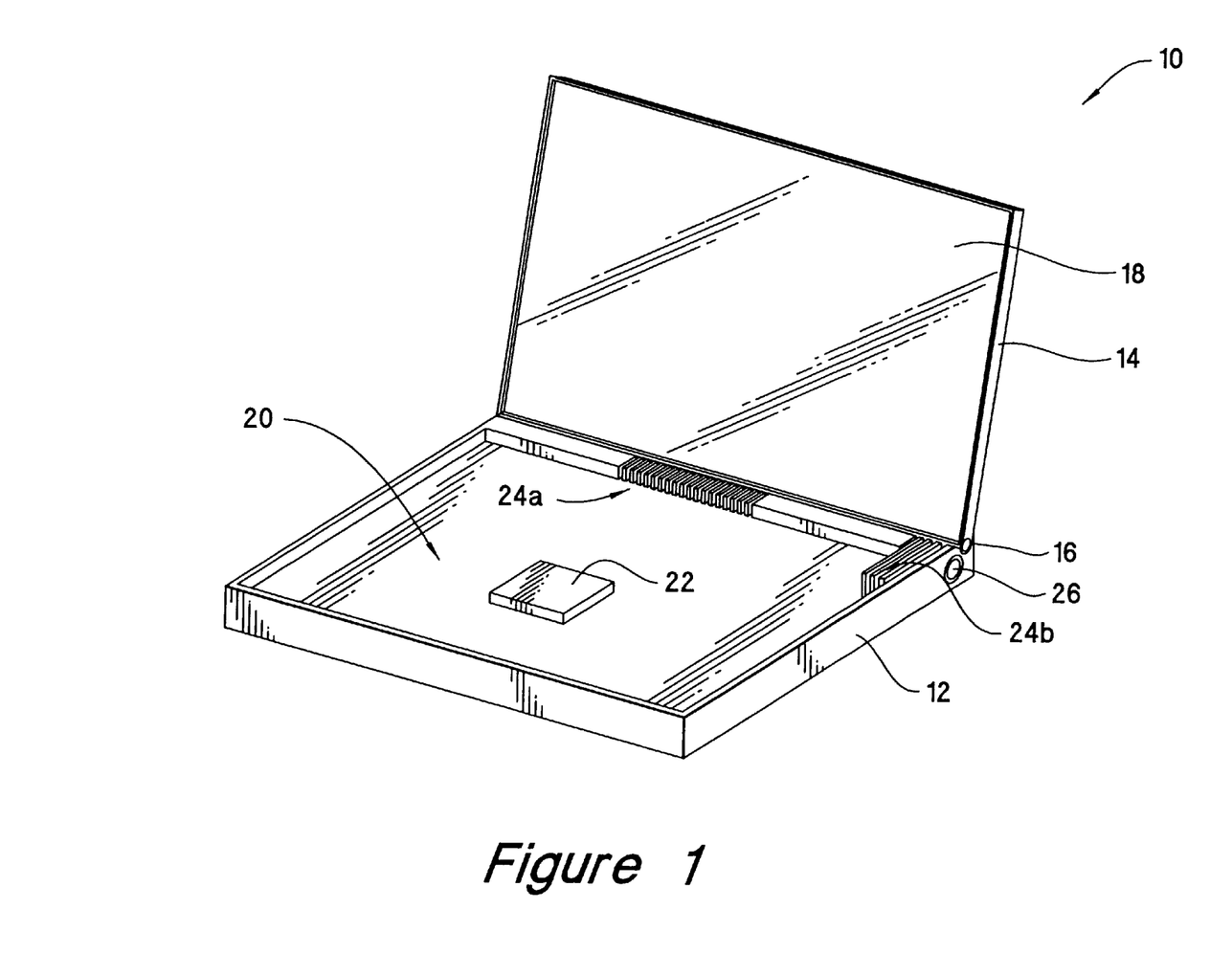
FIG. 1 is a perspective view, viewed from the right-front, of a portable computer having a chassis member of the present invention. The keyboard and electronics of the portable computer are removed to make visible a chassis member of the present invention.

Turning now to FIG. 1, an item of electronic equipment is illustrated and in particular, portable computer 10 is shown as a means to describe the preferred embodiments of the invention.

The portable computer 10 has two structural parts, chassis member 12, which forms the lower chassis and chassis member 14, which forms the upper chassis. Chassis member 12 and chassis member 14 are joined by hinge 16. Viewing screen 18 is mounted to chassis member 14 while a keyboard and various electronic components, none of which are illustrated, would be mounted to chassis member 12. The items mentioned in the previous sentence which are not illustrated are omitted in order to reveal base 20 which is the part of chassis member 12 to which a keyboard and various electronic components would be attached for a complete, functioning portable computer.

Base 20 is a surface which may be smooth or may have irregular features depending upon manufacturing and design preferences. Base 20 may also have apertures if desired. At least a portion of base 20 is sufficiently thick as to accommodate a cavity in the form of a channel which will be described in further detail below. Base includes pedestal 22 which is a surface area somewhat elevated above the general surface area of base 20. Finned area 24a is located at the center rear periphery of chassis member 12 and finned area 24b is located at the right rear corner of chassis member 12. Fan 26 is located at the right rear side of chassis member 12.

It should be understood that the locations of pedestal 22, finned areas 24a and 24b, and fan 26 are representative and alternate locations may be chosen within the spirit of the invention. In fact, in some embodiments of the invention, any or all of these items may be omitted from portable computer 10. Another type of heat sink, other than a finned area heat sink, could be provided.

Chassis member 12 is preferably constructed of magnesium or of one of its alloys although aluminum, plastics, or other materials could be used within the spirit of the invention. Casting or molding are the preferred methods of fabrication of chassis member 12. The Thixomolding process is a preferred method of molding magnesium. "Thixomolding" is a trademark. THIXOTECH, Inc., a corporation having its offices at Calgary in Alberta, Canada, is engaged in the business of Thixomolding.

Finned areas 24a and 24b may be formed by casting them as an integral part of chassis member 12. Alternatively, chassis member 12 may be first cast without finned areas and subsequently, finned areas 24a and 24b may be formed by shaving individual fins, a process which is referred to as "skiving." A further manner of providing finned areas 24a and 24b is to fabricate them and subsequently attach them to chassis member 12. In this and other embodiments described herein, pedestal 22 may be cast as an integral part of base 12 but could be constructed from a separate piece of material fastened to base 12.

Figure 2:
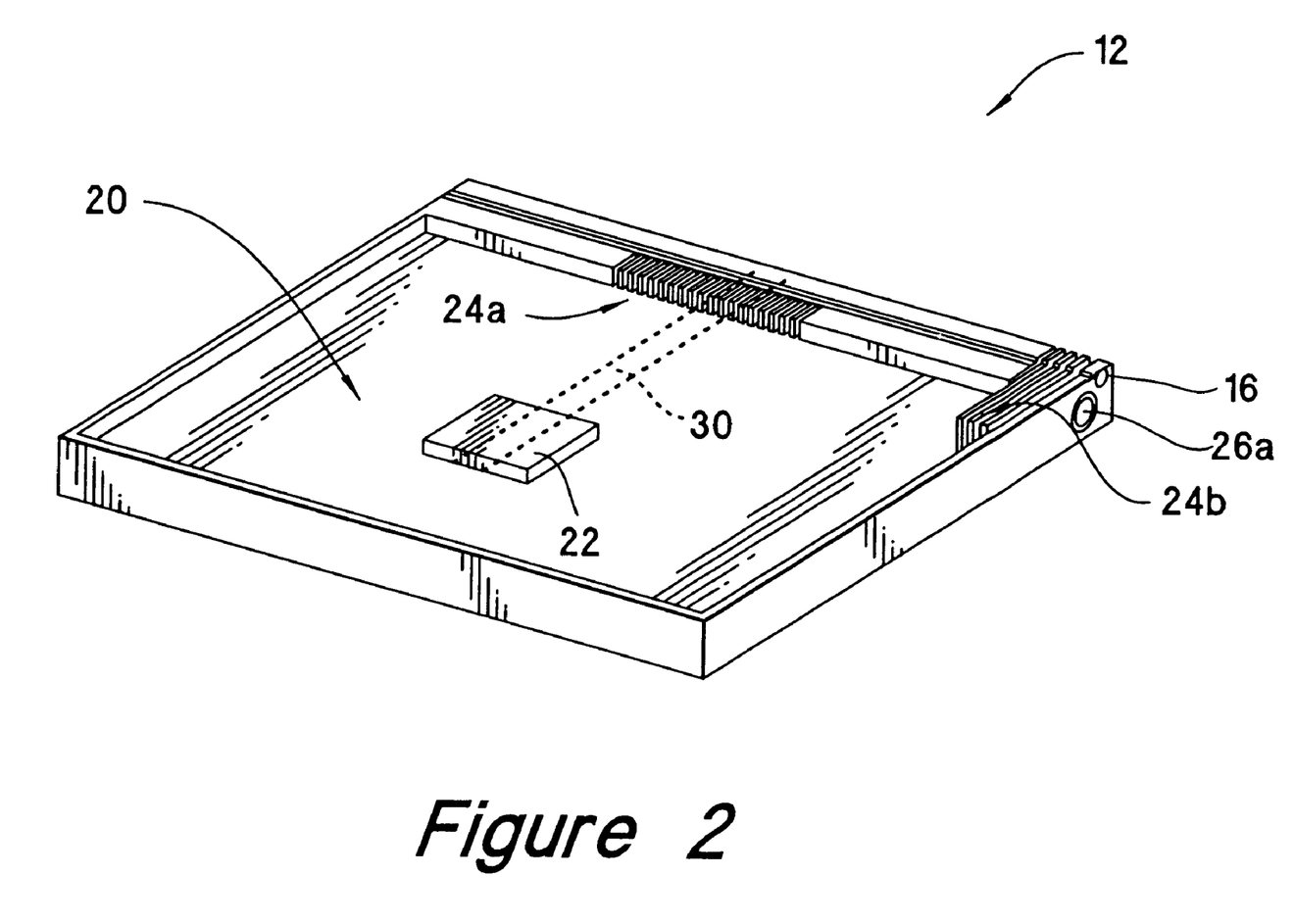
FIG. 2 is a perspective view of a chassis member of the present invention with hidden lines to illustrate the location of a heat dissipation cavity of the present invention, the cavity being in the form of a channel.

Turning now to FIG. 2, chassis member 12 is illustrated with like numbers indicating like elements that are illustrated in FIG. 1. Fan hole 26a is an aperture through chassis member 12 which provides a path for air flow caused by fan 26. Channel 30 is indicated in hidden lines. Channel 30 is located under the surface of base 20. Channel 30 extends from a location under pedestal 22 to the rear of chassis member 12 and at the rear of chassis member 12, channel 30 is located under finned area 24a. The location of channel 30 is representative in that any location under the base could be chosen within the spirit of this invention.

Figure 3:
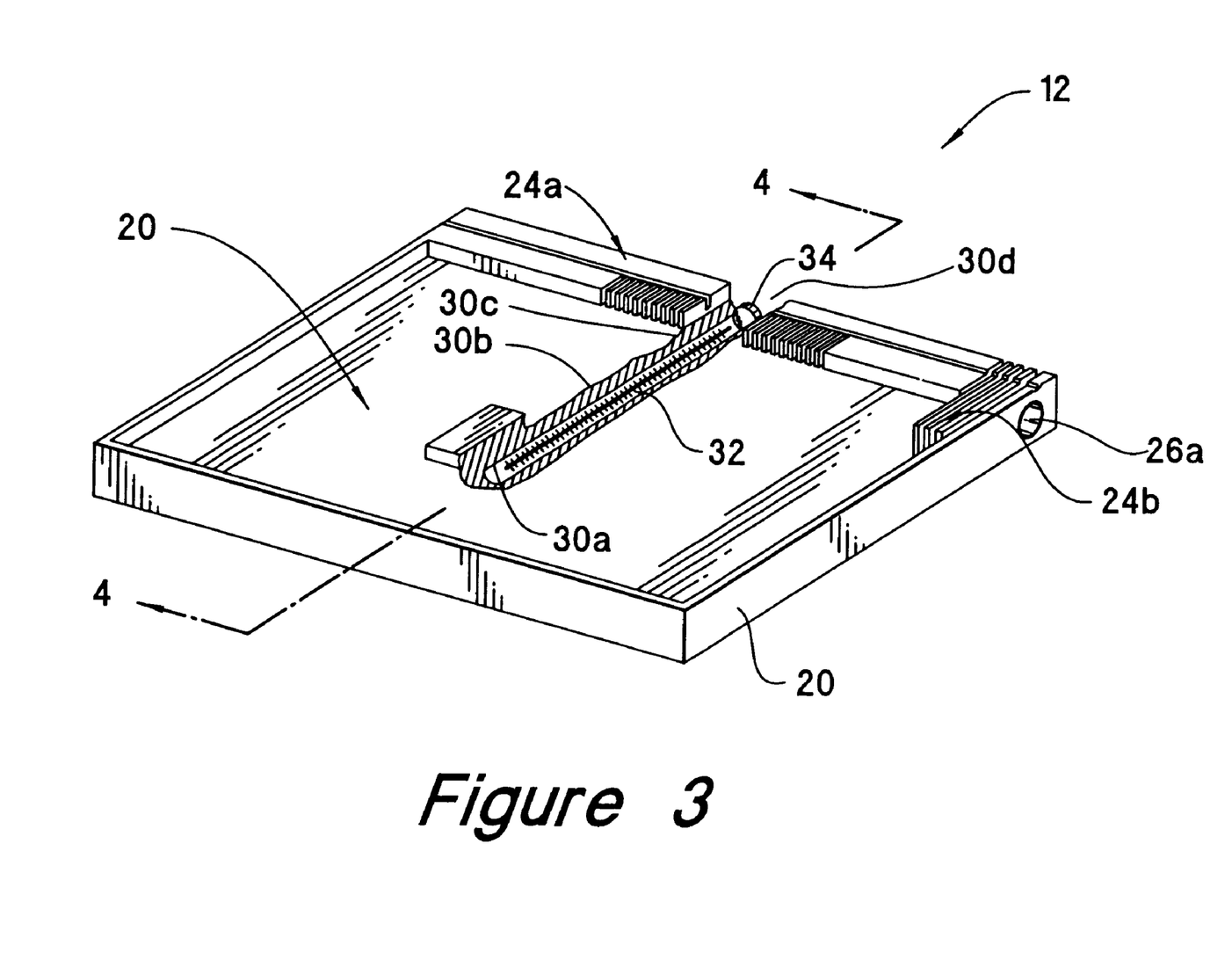
FIG. 3 is a perspective view of the chassis member of FIG. 2 with a cut away portion exposing a heat dissipation cavity of the present invention.

Turning now to FIG. 3, chassis member 12 is again illustrated. This figure features a cut-away portion in which material of base 20 is cut away to provide a view of the interior of channel 30. Channel 30 provides a cavity in the form of a channel for a heat pipe, the function of which will, in the following paragraphs, be described in further detail. Channel 30 has an evaporator section 30a, an adiabatic section 30b, and a condenser section 30c. A wick may optionally be used with the present invention. In a preferred embodiment, a wick 32 extends lengthwise within channel 30.

Channel 30 has two ends along its length and in this embodiment at least one of these ends is comprised of channel access 30d which extends through the surface of chassis member 12. As shown in FIG. 3, the particular location in which channel access 30d extends through the surface of chassis member 12 is at the rear side of chassis member 12, under finned area 24a. Condenser section 30c, which is adjacent to channel access 30d, is in thermal communication with finned area 24a. However, it would not be a departure from the spirit of the invention for channel access 30d to be located on the front, left, or right sides of chassis member 12, or for channel access 30d to be located on the surface of base 20 or on the surface of chassis member 12 that is opposite base 20.

Seal 34 is located at channel access 30d. Seal 34 functions to retain working fluid 36 within the cavity provided by channel 30 and to maintain an air-tight seal or evacuation within channel 30. Seal 34 may be constructed as a plug that occupies part of channel 30, as illustrated in FIG. 3, or seal 34 may be a cap that covers channel access 30d from outside channel access 30d. Seal 34 may be constructed of magnesium, another metal, plastic, or epoxy, for example. Depending upon the material used to fabricate seal 34, seal 34 may be fastened to chassis member 12 by braising, gluing, or other means. A narrow hole, such as a "pin hole", may be provided as a feature of seal 34 and then evacuation of channel 34 may be performed followed by a "pinch-off" or by otherwise sealing of the narrow hole to complete the sealing process.

Figure 4:
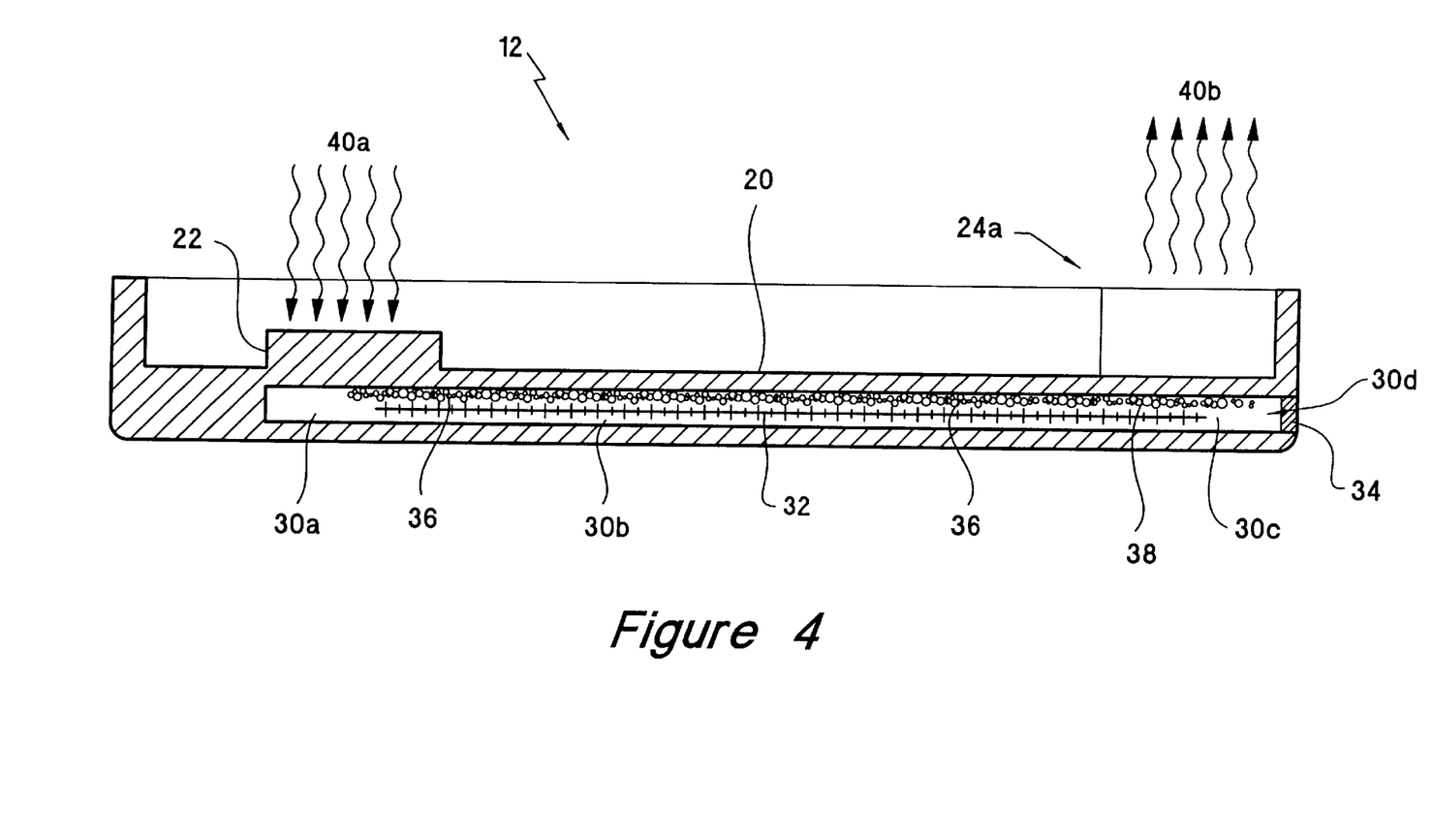
FIG. 4 is a section view, taken along the lines of 4—4 as indicated in FIG. 3.

Now turning to FIG. 4, chassis member 12 is illustrated in section, taken along the lines 4—4 of FIG. 3, in a right elevation view. The cut-away portion of the chassis reveals the location of channel 30. Channel 30 contains a working fluid 36 and fluorinert, FC-72 provided by the 3M (Minnesota Manufacturing and Mining Corporation), is a preferred working fluid but others such as water or a hydro-fluorinated-carbon such as R134A may be used. Preferably, non-flammable working fluids are used.

Since FC-72 has a boiling point at atmospheric pressure for the temperatures encountered when using the invention, it is not necessary to evacuate channel 30 when FC-72 is used. Water is an example of a working fluid that has a higher boiling point so it may be desirable to evacuate channel 30 if water is chosen as the working fluid. However, water is generally considered to be incompatible with magnesium and aluminum. Vapor 36, which is a vapor form of the working fluid, is illustrated near evaporator section 30a but vapor is present, to some degree, throughout channel 30. Condensate 38, which is a liquid form of the working fluid, is illustrated near condenser section 30c but condensate 38 is present, to some degree, throughout channel 30. In another part of this specification, working fluid is also referred to using the reference numeral 38.

Absorbed heat 40a is heat which is produced by an electronic component and which is absorbed in evaporator section 30a. The heat producing electronic component is mounted on base 20 or in thermal proximity to base 20. The heat producing electronic component may be mounted on pedestal 22.

Dissipated heat 40b is heat which is liberated from vapor 36 in condenser section 30c when vapor 36 undergoes a phase change to become condensate 38.

Figure 5:
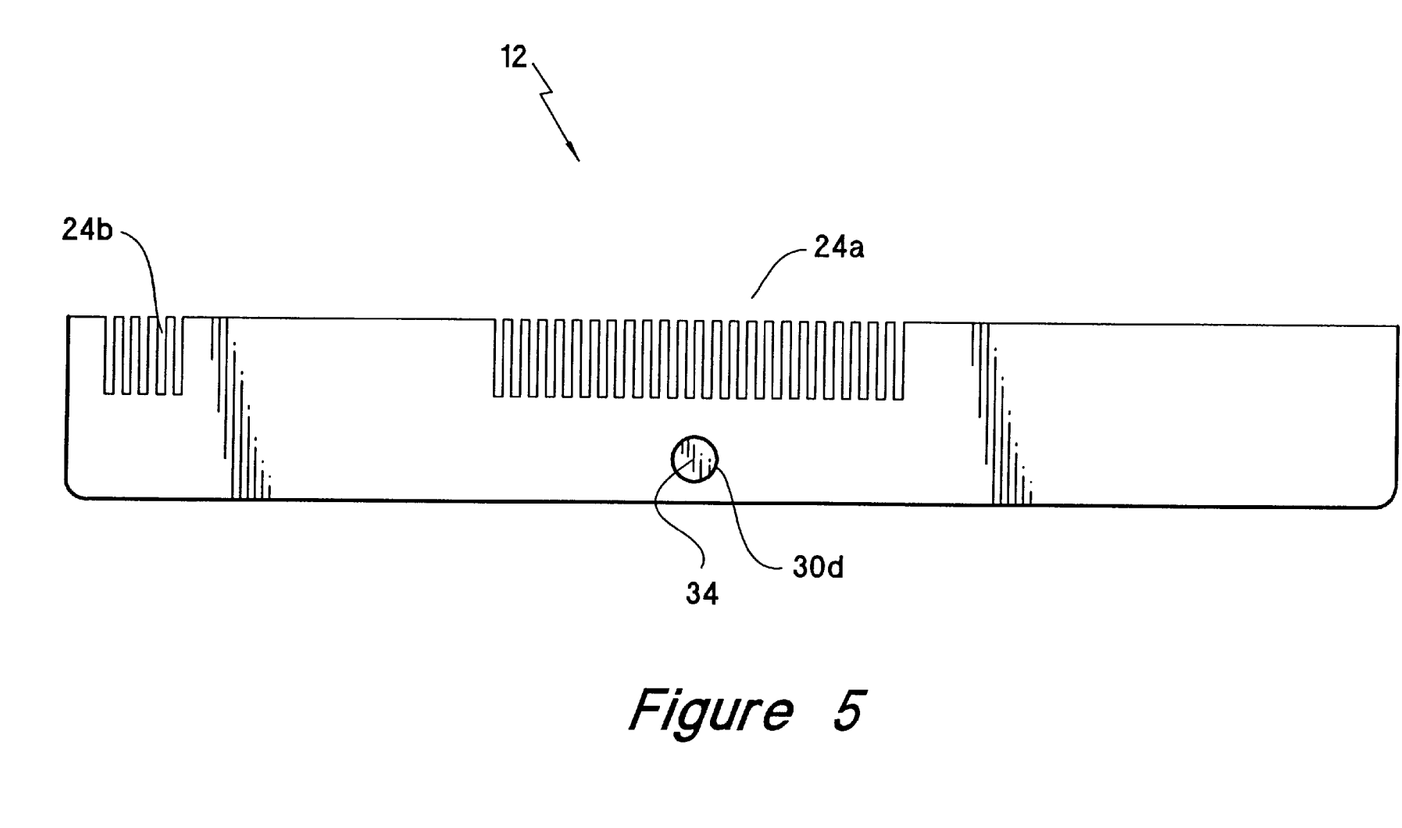
FIG. 5 is an elevation view, viewed from the rear, of the chassis member of FIG. 2.

Now turning to FIG. 5, a rear elevation of chassis member 12 is illustrated. Hidden lines are used to show the location of base 20. Channel access 30d is shown as a circular opening occupied by seal 34.

A preferred method of fabricating the invention is described in this and following paragraphs, and with reference to FIG. 4. Chassis member 12 is cast or molded as an integral piece of material, including base 20 and optionally including pedestal 22 and finned areas 24a and 24b as part of the same integral piece of cast material. Structural material surrounding channel 30 and which forms the side walls of channel 30 which will contain working fluid 36 is likewise an integral part of chassis member 12 in that such structural surrounding material homogeneous to material of base 20, is formed in the same manufacturing step as the formation of base 20 and chassis member 12. Thus, for example, if casting is the method of fabrication of chassis member 12 and base 20 then the structural material surrounding channel 30 and which forms the side walls of channel 30 is cast as an integral part of the same piece to which chassis member 12 and base 20 are cast. Further discussion of the meaning of "integral" for the purposes of this specification follows a few paragraphs later.

In the prior art, non-integral prior art heat pipes are fabricated as units that are separate from chassis member 12. Such separate heat pipes are mechanically fastened to chassis member 12, as by screws, clips, or other fasteners, or by welding, soldering, epoxy or by way of fixtures or receptacles fastened to or incorporated into the surfaces of chassis members or bases. As mentioned above, prior art heat pipes have a junction between the heat pipe and the chassis member that the heat pipe is attached to. This junction introduces thermal contact resistance, that is, it reduces heat conductivity at the junction making heat dissipation more difficult to achieve.

As described above, and elsewhere herein, the present invention provides a heat pipe that is integral to the chassis member. Accordingly, some embodiments of the present invention are able to avoid the use of a contact junction.

Channel 30 is bored using a drill or other boring device. Boring commences from channel access 30d and continues to a desired length of channel 30. Care is taken such that channel 30 is bored within the material of chassis member 12 and to not penetrate the surface of chassis member 12 other than at channel access 30d. However, if a fabricator chose to provide channel 30 as penetrating the surface of chassis 12 thereby providing two points that would serve as channel access 30d, the manufacturer could provide two seals 34, one for each of the two channel access 30d to seal both such two channel access 30d.

If one were to deposit, plate, or otherwise coat or cover the interior surface walls of channel 30 with some material, or if someone were to diffuse some material into the surface walls of channel 30, this would nevertheless result in a channel 30 that is integral to the chassis member since the structural material surrounding channel 30 would continue to be integral to chassis member 12.

After channel 30 is provided, wick 32 is either inserted into channel 30 or is fabricated within channel 30. The types of wicks 32 that can be inserted into channel 30 include, but are not limited to, fiber bundles and mesh.

The types of wicks 32 that can be fabricated within channel 30 are sintered wicks, grooved wicks, and rough surface wicks. A sintered wick is fabricated by inserting a rod in channel 30 wherein the rod has a smaller diameter than channel 30 such that a vacant space is between the rod and the wall of channel 30. Powered material is deposited into channel 30 to fill the vacant space. Then heat is applied to channel 30, or to part of it, to increase the temperature of powdered material sufficiently high as to cause sintering. The sintered material comprises the sintered wick.

A grooved wick is fabricated by using a mechanical scribe to scribe grooves lengthwise along the length of channel 30. A mechanical scribe would be attached to a scribe holder that is sufficiently small in diameter and long as to allow entry of the scribe throughout the length of channel 30. Grooves may be scribed individually if preferred. Since magnesium is a soft metal, this material is amenable to such a grooving process.

A rough surface wick is fabricated by using a mechanical roughening tool to create a roughened surface throughout the length of channel 30.

The pores or crevices that are created by a sintered wick, grooved wick, or roughened wick provide capillary action to facilitate a flow of condensate 38 from condenser section 30c to evaporator section 30a.

With channel 30 and wick 32 provided, a quantity of working fluid 36 is deposited into channel 30. Channel 30 is then evacuated and seal 34 is attached to chassis 12 such that seal 34 seals channel 30 from the environment and seal 34 thereby maintains the evacuated state of channel 30, if such a state is chosen, while confining vapor 36 and condensate 38, both of which are forms of working fluid 38, within channel 30. One method of accomplishing the foregoing is to deposit working fluid 38 into channel 30 and fasten seal 34 to channel access 30d but leave a small opening between seal 34 and channel access 30d for escape of gas. Then chassis member 12 or part of it near channel 30 is heated such that gas, including some vapor 36 escapes from channel 30. Seal 34 is then completed to fully seal channel 30 such that when chassis member 12 cools to ambient temperature an evacuated state is provided for channel 30.

This and following paragraphs, with reference to FIG. 4 will describe the operation of the invention. An electronic device, or a plurality of them, none of which are shown, are attached to base 20 and a conventional means is used to place the electronic device in thermal communication with base 20 or optionally to pedestal 22, if pedestal 22 is provided. Heat from an electronic device is illustrated as absorbed heat 40a as it flows through base 20 into evaporator section 30a. In evaporator section 30a, absorbed heat causes condensate 38 to undergo a phase change to become vapor 36. Vapor 36 travels through adiabatic section 30b to arrive at condenser section 30c where vapor 36 undergoes a phase change to become condensate 38 thereby liberating absorbed heat 40a. The liberated heat is identified as dissipated heat 40b and dissipated heat 40b is absorbed from condenser section 30c into a heat sink, which may a finned area 24a previously described. Finned area 24a radiates dissipated heat 40b into the ambient air. Condensate 38 is drawn into wick 32 and moves along wick 32 to return to evaporator section 30a and the process proceeds as continuous cycle. The present invention thereby provides a heat pipe that is integral to chassis member 12.

In one embodiment, the condenser section 30c of channel 30 is fabricated such that it is elevated with respect to the evaporator section 30a. Thus channel 30 is oriented at an angle to the resting position of the chassis member 12 rather than horizontal to the resting position of chassis member 12. This elevated position provides for gavitation forces to assist the return of the condensate of working fluid 36.

Figure 6:
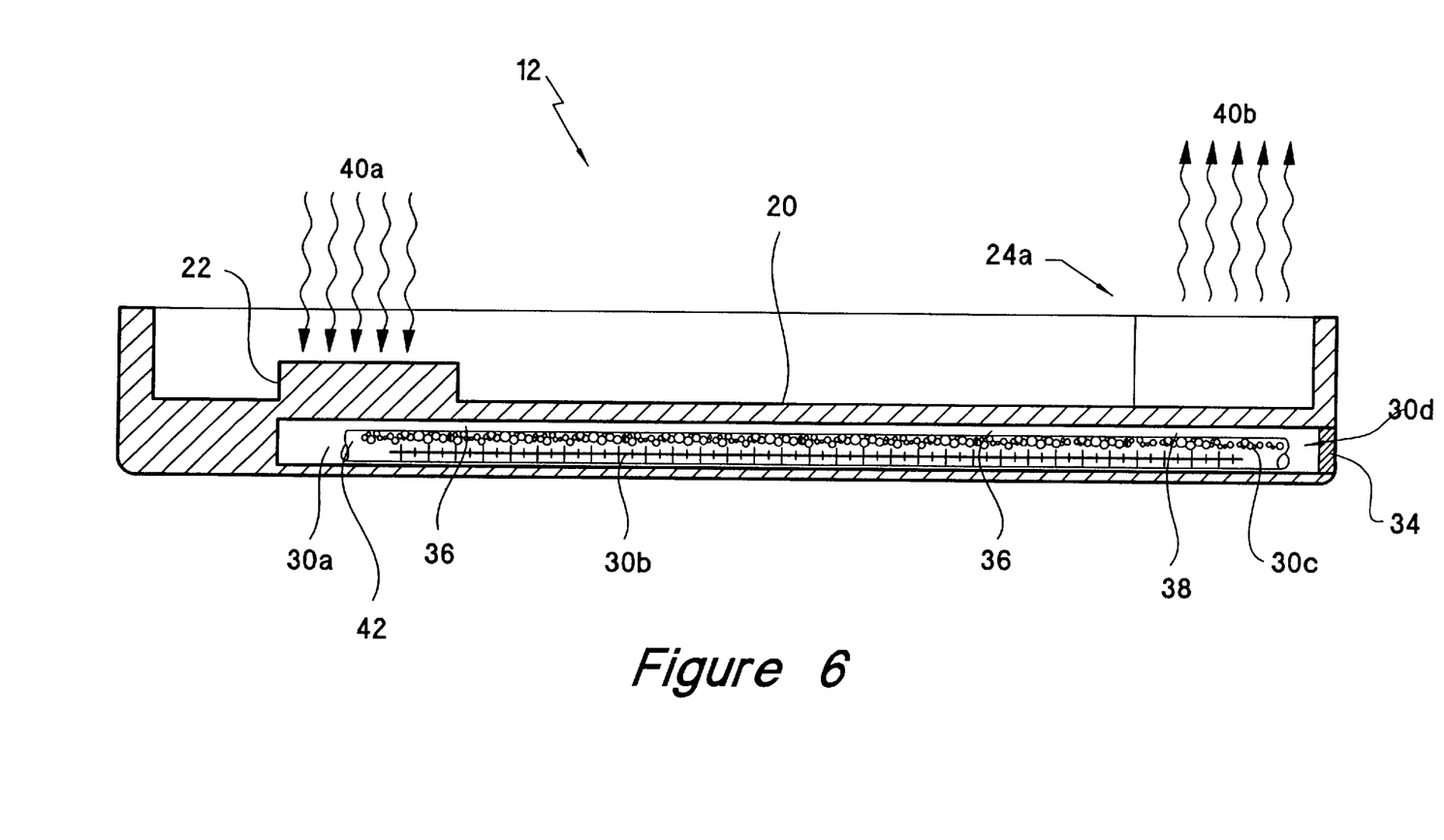
FIG. 6 is the elevation view of FIG. 4 except that another embodiment of the invention is illustrated.

In another embodiment, illustrated in FIG. 6, chassis member 12, base 20, and channel 30 are fabricated as described above. In this embodiment, a complete heat pipe 42 formed by conventional means is inserted within the cavity provided by channel 30 and seal 34 is added. In this embodiment, seal 34 would not need to maintain an evacuated channel 30 since the evacuated location would be within heat pipe 42. To improve the thermal interface between heat pipe 42 and its evaporator region, a suitable heat conducting filler may be added to fill any void space, likewise with the condenser region.

In the embodiments described above, and in each of the other embodiments described herein, the cavity and the working fluid dissipate heat by transferring the heat from a hot location on the chassis member to a cold location on the chassis member. A "hot location" as referred to herein is a location whose temperature has been elevated by heat produced by a heat generating electronic device. A "cold location" as referred to herein is a location whose temperature is closer to ambient temperature than a hot location. With ambient temperature being, for example, room temperature if the portable electronic equipment is used in a room. The hot location serves as the evaporator section of a heat pipe, the cold location serves as the condenser section of a heat pipe, and portions of a cavity that link hot and cold sections serve as adiabatic sections.

In the embodiments described above, and in each of the other embodiments described herein, evaporator sections are those locations on chassis member 12 that are close to hot locations and condenser sections are those locations on chassis member 12 that are close to cold locations. Working fluid 36 receives heat in hot locations and moves to cold locations. The movement of working fluid may take the form of movement of the vapor phase form of working fluid 36. Working fluid 36 gives up its heat at cold locations and condenses to liquid phase. Working fluid 36 moves back to hot locations of chassis 12 and the cycle repeats. The movement of working fluid, especially movement from cold locations to hot locations may be facilitated by wick 32.

Although the inventors find it convenient to refer to channel 30 as a cavity, channel 30 could just as well be referred to as a "vessel" as both are equally suitable nomenclature so far as the inventors are concerned. Likewise for each of the embodiments referred to below, the different embodiments of "cavities" could just as well be referred to as different embodiments of "vessels." The different embodiments of the cavity provided by the present invention contain working fluid 36 and therefore the different embodiments of cavities function as vessels.

Figure 7:
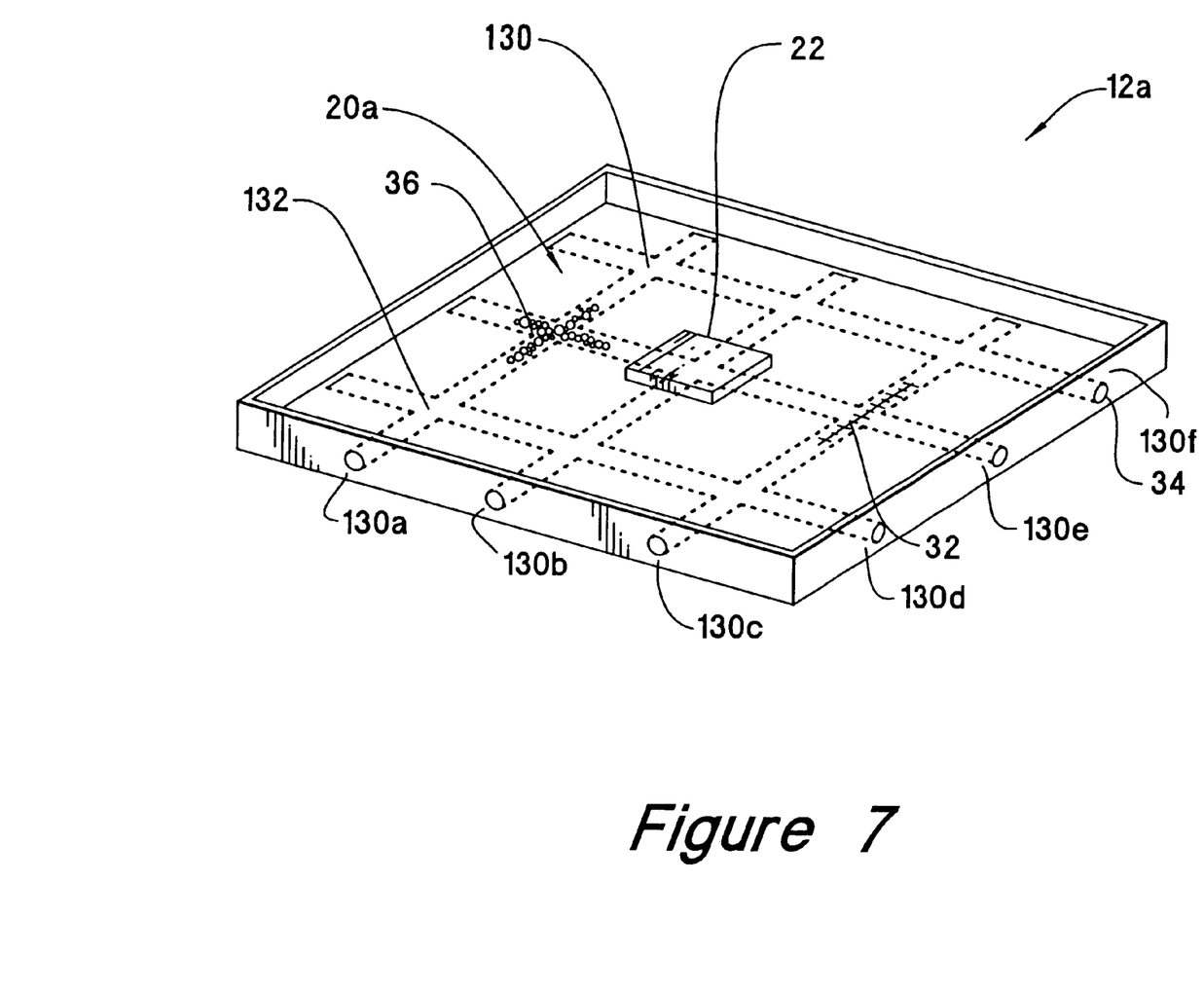
FIG. 7 is a perspective view of a chassis member of an alternative embodiment of the present invention with hidden lines to illustrate a heat dissipation cavity that is made up of a channel matrix which is integral to the chassis member.

Turning now to FIG. 7, an alternative embodiment of the invention is illustrated. Chassis member 12a is illustrated with like numbers indicating like elements that are illustrated in FIG. 2. A cavity is provided by heat dissipating channel matrix 130 which is integral to chassis member 12a and is formed of channels 130a to 130f which are indicated in hidden lines. Channels 130a to 130f are located under the surface of base 20a. Channels 130a, 130b and 130c extend from the front of chassis member 12a to the rear of chassis member 12a but do not need to pass through the rear of chassis 12a since such rear passage would require application of two seals to seal a channel. Channels 130d, 130e, and 130f extend from the left of chassis member 12a to the right of chassis member 12a. Working fluid 36 is within channel matrix 130 and can flow from any channel to any other channel comprising the matrix.

The locations of channel 130a to 130f are representative in that locations could be chosen within the spirit of this invention to be at any location within chassis member 12a. Selection of channel location could be done to provide a heat dissipation means for certain heat producing electronic components mounted to chassis member 12a. Locating channels to provide a heat dissipation means for certain heat producing electronic components may be referred to as "preferential location." In other words, preferential location of channels provides certain locations of base 20 that have enhanced heat dissipating capability.

Channels can be located to provide a heat communication path to a heat sink. Channels could be oriented to provide gavitation assisted flow of condensed working fluid 36 to certain desired locations of channel matrix 130.

A channel matrix 130 having approximately equally spaced channels such as that illustrated in FIG. 7 can provide an approximately equal dissipation of heat throughout the entire chassis 12a. A channel matrix 130 having channels located in a particular part of chassis 12a can provide heat dissipation that is more localized.

Channels 130a to 130f, and chassis 12a may be fabricated and sealed in the same fashion and with any or all of the features or materials of chassis 12 and channel 30 of the embodiments described above with reference to FIGS. 1 through FIG. 6. Thus, for example, a wick structure could be provided within any or all of channels 130a to 130f. A working fluid 36 is contained within all of the channels that are part of the channel matrix 130.

In the illustrated embodiment of channel matrix 130, each of channels 130a to 130f is intersected by three other channels. Thus, for example, channels 130a, 130b, and 130c are each intersected by channels 130d, 130e, and 130f. The intersections provide a path by which working fluid 36 may move from one channel to another and this movement may occur in the fluid or vapor phase of working fluid 36.

In one embodiment of channel matrix 130, only two channels are provided for example, 130b and 130e which are illustrated to intersect below pedestal 22. In this embodiment, channels 130a, 130c, 130d, and 130f are omitted. This embodiment provides heat dissipation from the area of pedestal 22 to the areas along channels 130b and 130e. In a different two channel embodiment of channel matrix 130, intersecting channels 130a and 130d are provided and other channels omitted. A channel matrix 130 could be defined as consisting of two or more intersecting channels wherein a fluid communication path is provided from any channel within the matrix to all other channels within the matrix. Naturally, it would be possible to provide more than one matrix, thus a plurality of matrices, within the same chassis member 2a.

In FIG. 7, there are illustrated nine channel intersections, one of which is indicated by the reference number 132. An intersection need can be in the form of an "L" shape or a "T" shape, for example, and there is no requirement that the intersection be in the form of a "+" shape. That is, an intersection is a fluid communication path between two channels and there is no need for a channel to extend through and beyond the channel that is intersected.

In another embodiment, channels 130a and 130c are provided and mutually intersect channels 130d and 130f while channels 130b and 130e are omitted. In this embodiment, there are four intersections, with each channel being intersected twice.

Although the channels 130a to 130f are illustrated as parallel to a side of chassis member 12a, channels may optionally be provided with other orientations. Similarly, channels may be chosen in various numbers and may be located in various locations according to the heat dissipation behavior desired for chassis 12a. Intersections between channels provide a fluid communication path from one channel to another to provide a heat dissipation path from one channel to another and heat dissipation may occur while the working fluid 36 is in liquid phase, vapor phase, or in transition between phases.

The heat dissipating cycle of the channel matrix provides a cooling means to prevent overheating of electronic components. At warmer locations of channel matrix 130, heat sources dissipate heat into working fluid 36 and working fluid 36 changes into vapor which dissipates throughout channel matrix 130. At cooler locations of channel matrix 130, the working fluid vapor condenses to condensed working fluid 36. Capillary action or gravity causes the condensed working fluid 36 to flow back to warmer locations of channel matrix 130 and the heat dissipating cycle is repeated.

Figure 8:
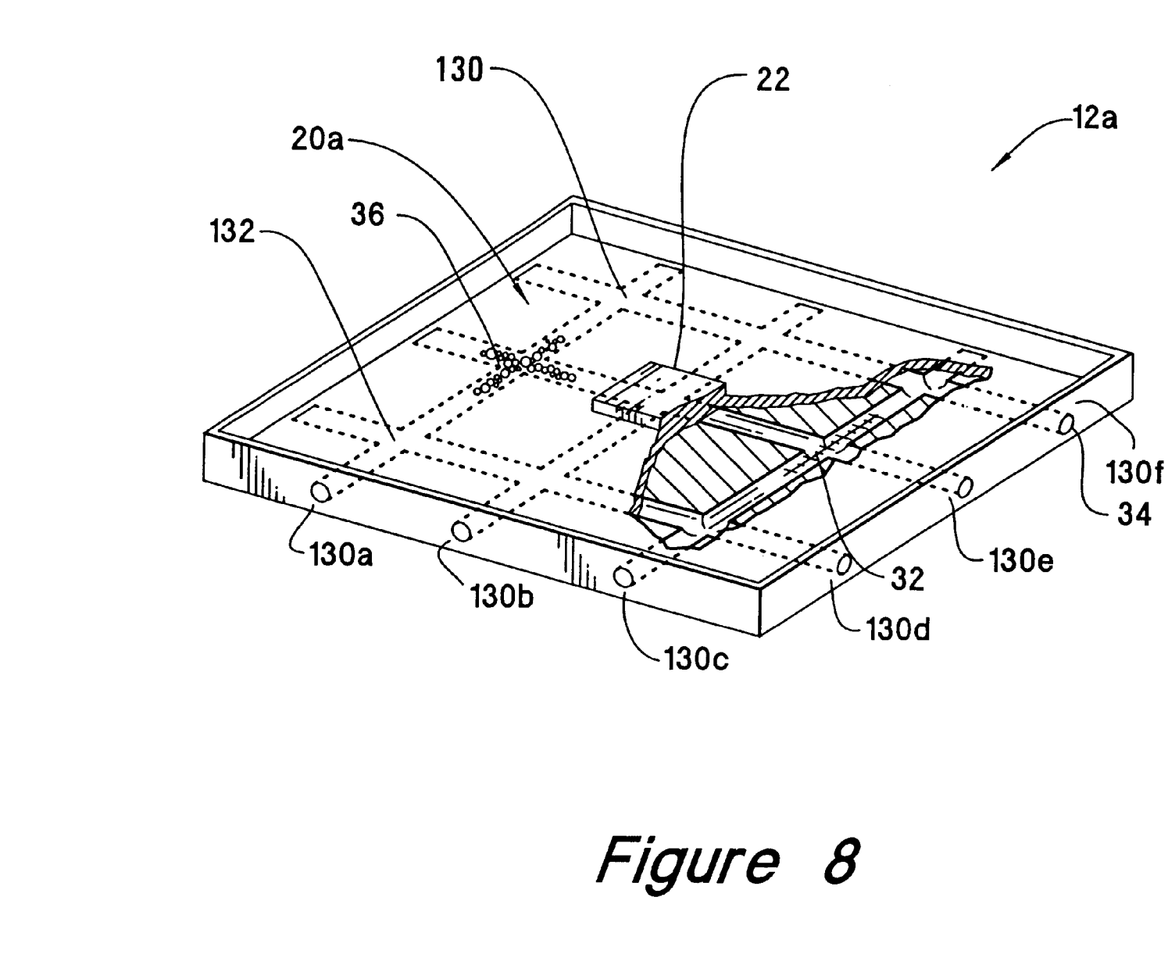
FIG. 8 is a perspective view of the chassis member of FIG. 7 with a cut away portion exposing a heat dissipation cavity of the present invention.

Turning now to FIG. 8, chassis member 12a is again illustrated. This figure features a cut-away portion in which material of base 20a is cut away to provide a view of the interior of channel matrix 130.

Figure 9:
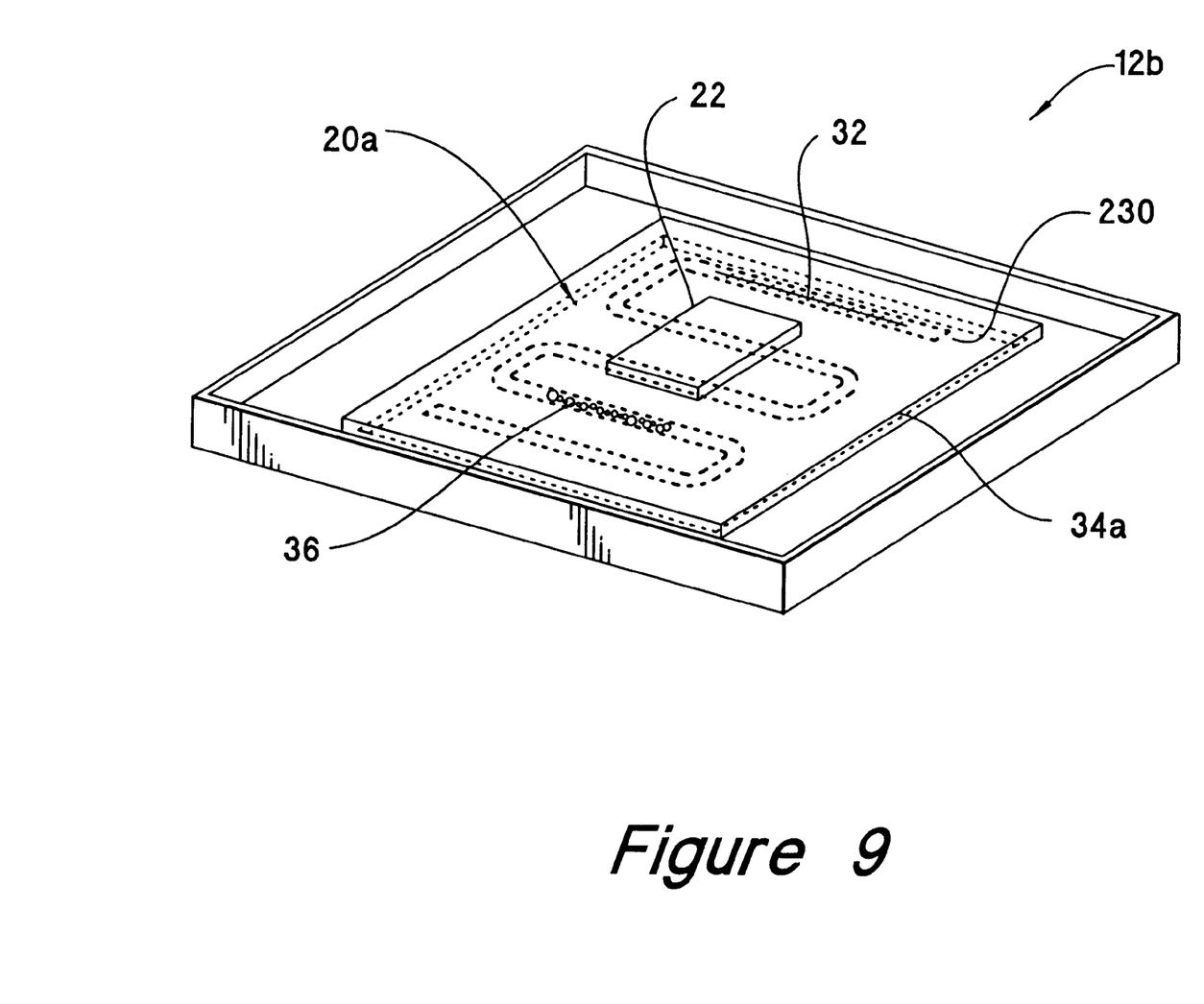
FIG. 9 is a perspective view of a chassis member of an alternative embodiment of the present invention with hidden lines to illustrate a heat dissipation cavity that is integral to the chassis member.

Turning now to FIG. 9, an alternative embodiment of the invention is illustrated. Chassis member 12b is illustrated with like numbers indicating like elements that are illustrated in FIG. 2. A cavity which is integral to chassis member 12b is provided by heat dissipating serpentine channel 230. Serpentine channel 230 is formed in a shape that resembles an "s" or a shape which could be referred to as a serpentine shape and which is indicated in hidden lines. The serpentine shape of serpentine channel 230 provides a path by which working fluid 36 may be dispersed to various locations on chassis member 12b.

An irregular channel shape may be provided as well, or a regular shape such as a rectangle, triangle, circle, channel of FIGS. 2–6, matrix of FIGS. 7 and 8, could be provided within the spirit of the invention. Such regular or irregular shapes could be fabricated and provided with features in the same fashion as the serpentine channel 230 described herein.

Serpentine channel 230 is recessed under a surface of chassis 12b. Base 20a is attached to and is a part of chassis member 12b. Unlike previously described embodiments, serpentine channel 230 is first fabricated open on one side of chassis member 12b. Serpentine channel 230 is formed by molding or casting the shape into chassis member 12b or may be formed by machining the channel into a previously molded or cast chassis member 12b.

Working fluid 36 is within serpentine channel 230 and wick 32 may be provided. Preferential location of serpentine channel 230 may be used with the invention as can gravity assisted flow of condensed working fluid 36.

Serpentine channel 230 and chassis 12b may be fabricated with any or all of the features or materials of chassis 12 and channel 30 of the embodiments described above with reference to FIGS. 1 through FIG. 6. Thus, for example, a wick structure could be provided within serpentine channel 230.

Serpentine channel 230 is sealed by seal 34a which also may function as base 20. Seal 34a is constructed of the materials of seal 34 provided for the embodiments described above. Seal 34a has a plate shape, that is, a flat shape, and covers serpentine channel 230. Seal 34a may be provided with pedestal 22. Seal 34a is braised, welded, or glued to chassis member 12b to seal serpentine channel 230.

Naturally, it would be possible to provide heat dissipating cavities for chassis member 12b in the form of more than one serpentine channel, more than one regular or irregular shape, or a combination of such cavities. A single seal 34a or a plurality of such seals could be used to seal such cavities.

Figure 10:
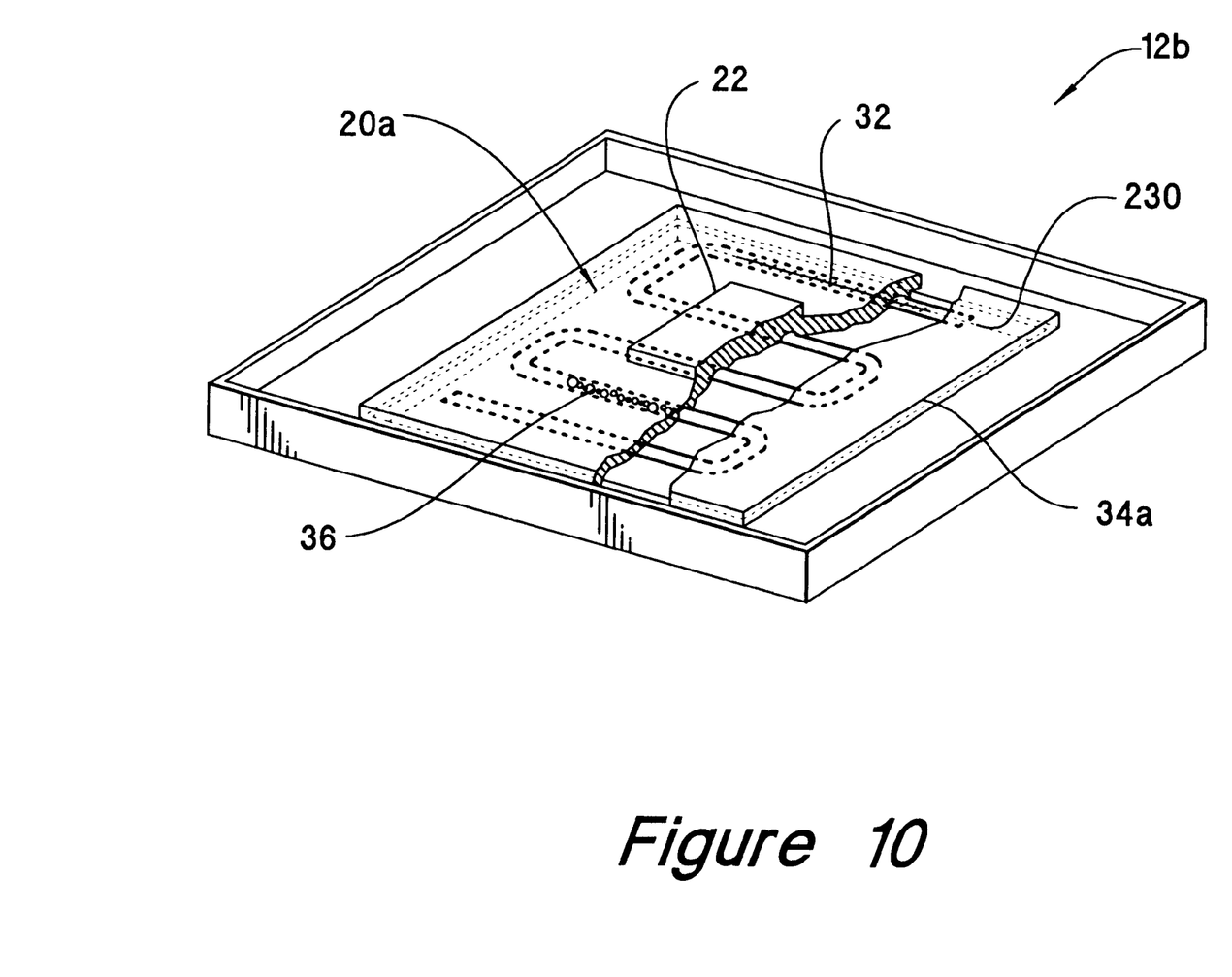
FIG. 10 is a perspective view of the chassis member of FIG. 9 with a cut away portion exposing a heat dissipation cavity of the present invention.

Turning now to FIG. 10, chassis member 12b is again illustrated. This figure features a cut-away portion in which material of seal 34a and of chassis member 12b are cut away to provide a view of the interior of serpentine channel 230.

Figure 11:
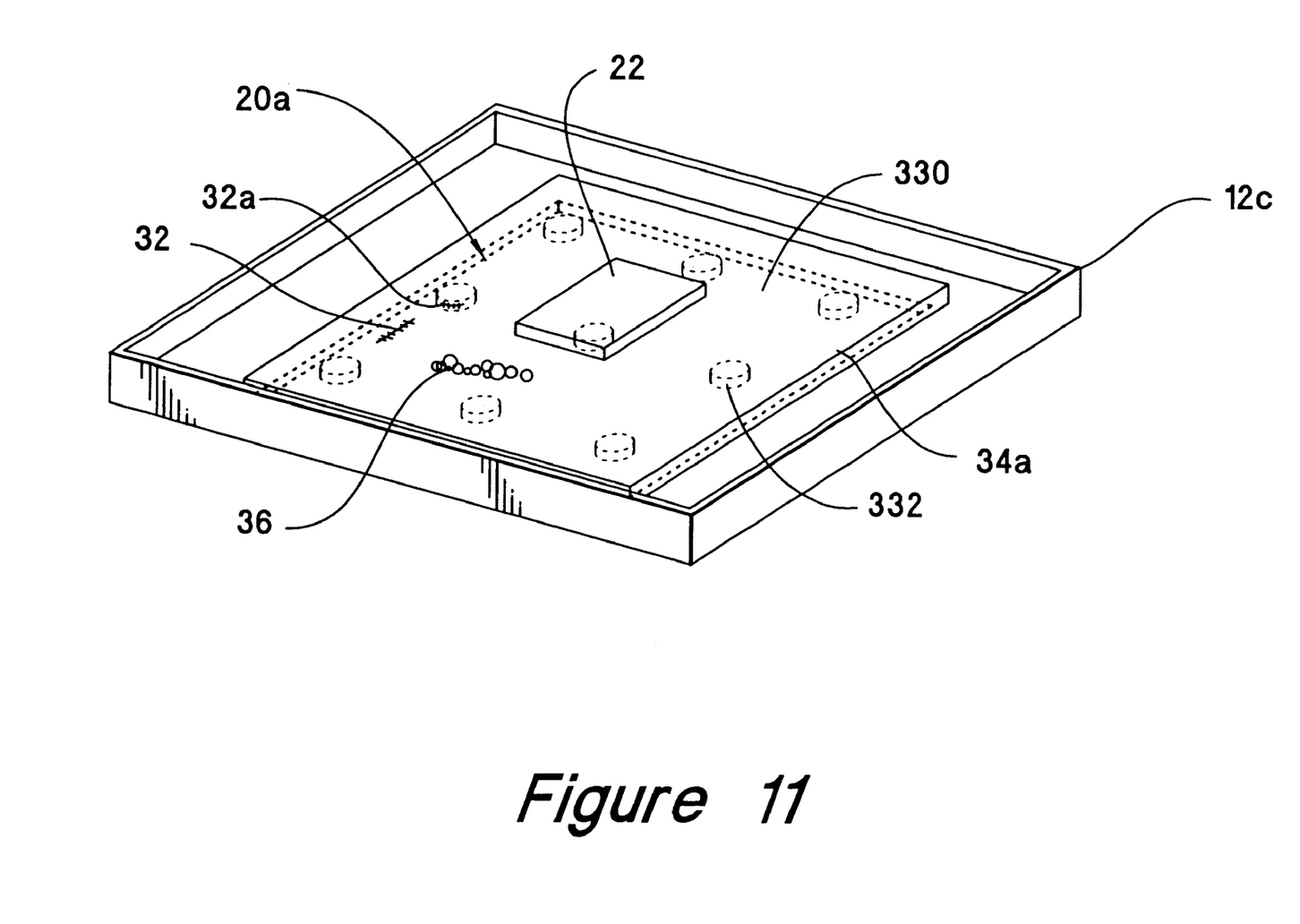
FIG. 11 is a perspective view of another embodiment of a chassis member of the present invention with hidden lines to illustrate a heat dissipation cavity that has a different shape from that of other embodiments.

Turning now to FIG. 11, an alternative embodiment of the invention is illustrated. Chassis member 12c is illustrated with like numbers indicating like elements that are illustrated in FIG. 2. A cavity which is integral to chassis member 12c is provided by heat dissipating rectangular cavity 330. Rectangular cavity 330 provides a path by which working fluid 36 may be dispersed to various locations on chassis member 12c.

As illustrated in FIG. 11, the cavity is in the shape of a square. Other types of rectangular, multi-angular, non-angular, regular or irregular, two-dimensional cavity shapes may be chosen and such choice would be dictated by the locations of heat producing components. The common feature of a square shaped cavity, or of any of the other shaped cavities described in this paragraph is that at any particular point they provide a two-dimensional path, for the flow of working fluid 36 in its liquid or vapor form. In contrast, a serpentine or straight channel shape provide at any particular point only a one dimensional path for flow of working fluid 36. A matrix provides a two dimensional path for fluid flow but such provision is only at intersections of channels.

Rectangular cavity 330 is located under the surface of base 20a. Similar to serpentine channel 230, rectangular cavity 330 is formed by molding or casting the rectangular shape into chassis member 12c or may be formed by machining the rectangular shape into a previously molded or cast chassis member 12c.

Rectangular cavity 330 is generally flat in shape in that its length and width dimensions are much wider than the dimension of the depth of the cavity. By "depth", the inventors mean the dimension of rectangular cavity 330 if measured in a vertical direction through chassis member 12c, that is, through the thin dimension of chassis member 12c. If the width of rectangular cavity 330 were designed to approach the dimension of the depth of rectangular cavity 330, then a "channel" shape would result, rather than a flat shape. The surfaces of rectangular cavity 330 need not be smooth and roughness may be desired to serve as a wick function.

Rectangular cavity 330 need not occupy a large part of the area of chassis member 12c, the amount of area being a thermal dissipation design decision within the ability of those skilled in the art.

Working fluid 36 is within rectangular cavity 330 and wick 32 may be provided. Preferential location of rectangular cavity 330 may be used with the invention as can gravity assisted flow of condensed working fluid 36.

Rectangular cavity 330 and chassis 12c may be fabricated with any or all of the features or materials of chassis 12 and channel 30 of the embodiments described above with reference to FIGS. 1 through FIG. 6. Thus, for example, a wick structure could be provided within rectangular cavity 330.

Rectangular cavity 330 is sealed by seal 34a which is constructed in the same fashion as seal 34a is constructed for the embodiment illustrated by FIGS. 9 and 10.

Rectangular cavity 330 may be provided with supports such as that illustrated as support 332. Support 332 offers compressive strength to provide mechanical support to seal 34a in order to prevent deformation of seal 34a in the event of mechanical pressure on the outside of seal 34a. Since seal 34a also serves as base 20a upon which heat producing components may be attached it may happen that mechanical forces are placed upon seal 34a. Support 332 can also be located and sized in order to provide a conductive path for heat flow from base 20a into cavity 330.

In one embodiment of cavity 330, wick 32 is disposed in a planar fashion, the plane of the wick being parallel to the plane of cavity 330. In another embodiment, wick can be disposed around support 332, or integrated into the structure of support 332, as is illustrated for wick 32a.

The depth of any of the cavities illustrated in FIGS. 9 through 11 can be chosen by those skilled in the art to provide heat transfer across the depth. This depth is occupied by a space which may be evacuated or not, by a working fluid in liquid or vapor form, and perhaps by a wick structure. A depth of one to three millimeters may be appropriate but would depend upon factors familiar to those skilled in the art.

Figure 12:
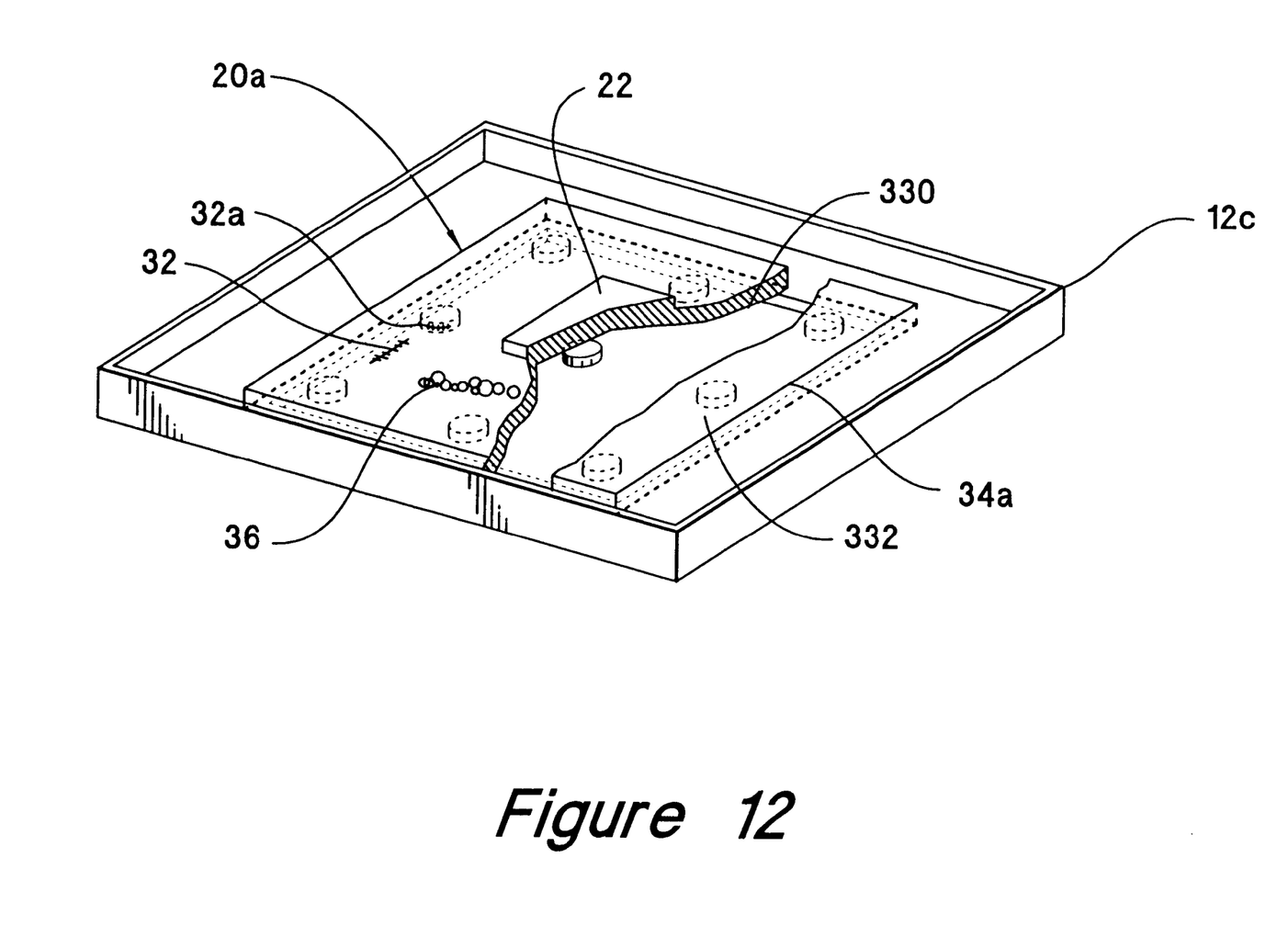
FIG. 12 is a perspective view of the chassis member of FIG. 11 with a cut away portion exposing a heat dissipation cavity of the present invention.

Turning now to FIG. 12, chassis member 12c is again illustrated. This figure features a cut-away portion in which material of seal 34a and of chassis member 12c are cut away to provide a view of the interior of rectangular channel 330.

Those skilled in the are will be capable of using various embodiments of the invention. Accordingly, the invention is not limited to the specific embodiments described and illustrated above. Instead, the invention is construed according to the claims that follow.

What is claimed is:

1. In a portable computer, a chassis member for supporting an electronic device that produces heat, said chassis member comprising:

a cavity integral to said chassis member, such that said chassis member was formed by molding a structural material and such that structural material surrounding said cavity and forming side walls of said cavity is homogeneous to said chassis member in that said structural material was formed by molding in the some manufacturing step as said chassis member was formed by said molding;

a seal, sealing said cavity;

a working fluid that is contained within said cavity by said seal;

wherein said cavity and said working fluid dissipate heat by allowing heat to transfer from a hot location on said chassis member to said working fluid, allowing movement of said working fluid within said cavity, and by allowing said heat to transfer from said working fluid to a cold location on said chassis member wherein said working fluid undergoes evaporation and condensation between vapor and liquid phases of said working fluid.

2. The chassis member of claim 1 wherein said cavity is a channel.

3. The chassis member of claim 1 wherein said cavity is a matrix of channels.

4. The chassis member of claim 1 wherein said cavity is serpentine in shape.

5. The chassis member of claim 1 wherein said cavity is a shape that provides a two-dimensional flow path for said working fluid.

6. The chassis member of claim 1 further comprising a wick located within said cavity wherein said wick facilitates movement of working fluid.

7. The chassis member of claim 2 further comprising a wick located within said cavity wherein said wick facilitates said movement of working fluid.

8. The chassis member of claim 3 further comprising a wick located within said cavity wherein said wick facilitates said movement of working fluid.

9. The chassis member of claim 4 further comprising a wick located within said cavity wherein said wick facilitates said movement of working fluid.

10. The chassis member of claim 5 further comprising a wick located within said cavity wherein said wick facilitates said movement of working fluid.

11. The chassis member of claim 6 wherein said wick is a roughened surface of said channel.

12. The chassis member of claim 9 wherein said wick is a roughened surface of said cavity.

13. The chassis member of claim 6 wherein said wick is a sintered wick.

14. The chassis member of claim 9 wherein said wick is a sintered wick.

15. The chassis member of claim 1 further comprising a pedestal located on said chassis member to thermally couple heat to the chassis member.

16. The chassis member of claim 2 further comprising a pedestal located on said chassis member to thermally couple heat to the chassis member.

17. The chassis member of claim 1 further comprising a heat sink located on said chassis member to thermally couple the chassis member to ambient air to provide said cold location on said chassis.

18. The chassis member of claim 2 further comprising a heat sink located on said chassis member to thermally couple the chassis member to ambient air to provide said cold location on said chassis.

19. The chassis member of claim 1 wherein said cavity is a channel and further comprising a tube contained within said channel, said tube containing said working fluid wherein said tube is a heat pipe.

* * * * *